United States Patent [19]
Pontius

[11] Patent Number: 5,614,846
[45] Date of Patent: Mar. 25, 1997

[54] LATCH CIRCUIT WITH STATE-WALK LOGIC

[75] Inventor: Dale E. Pontius, Colchester, Vt.

[73] Assignee: International Business Machines Corporation, Armonk, N.Y.

[21] Appl. No.: 548,632

[22] Filed: Oct. 26, 1995

[51] Int. Cl.⁶ .............................................. H03K 19/096
[52] U.S. Cl. ........................... 326/93; 326/26; 327/198; 365/230.08
[58] Field of Search ............................ 326/21, 17, 93–98; 327/198, 208, 210–212; 377/77, 78, 81; 365/230.08, 189.05

[56] References Cited

U.S. PATENT DOCUMENTS

| | | |
|---|---|---|
| 4,160,173 | 7/1979 | Aoki . |
| 4,985,643 | 1/1991 | Proebsting .................... 326/17 |
| 4,998,027 | 3/1991 | Mihara et al. . |
| 5,017,814 | 5/1991 | Lloyd ........................... 326/93 |
| 5,122,694 | 6/1992 | Bradford et al. . |
| 5,138,189 | 8/1992 | Leung et al. . |
| 5,289,430 | 2/1994 | Tran ............................. 326/93 |
| 5,329,176 | 7/1994 | Miller, Jr. ..................... 326/93 |
| 5,347,184 | 9/1994 | Stephens, Jr. et al. . |
| 5,373,204 | 12/1994 | Muramatsu .................... 326/93 |
| 5,424,980 | 6/1995 | Vinal ......................... 365/230.08 |
| 5,475,320 | 12/1995 | Ko ............................... 326/21 |

*Primary Examiner*—Edward P. Westin
*Assistant Examiner*—Benjamin D. Driscoll
*Attorney, Agent, or Firm*—Whitham, Curtis, Whitham & McGinn; Howard J. Walter, Jr.

[57] ABSTRACT

A latch circuit employs state-walk logic that makes the transition from "set" to "latched" states without the need for multiple phases, critical timing or introduction of extra periods into any timings to account for worst case scenarios. The has particular application to row address receivers for dynamic random access memories (DRAMs) and, in its basic form, comprises a pair of identical receiver circuits of opposite logic state when off, with clock and data inputs and true and complementary outputs. The receivers are turned on by an activating clock signal. When the receivers are enabled, address data is evaluated as soon as it is received causing the latch to be set. This is the first step in the "state walk" of the latch. The outputs of the latch are fed back to turn off the receiver circuits completing the second step of the "state walk". The circuit now ignores any changes in the input address data, thus latching the input data.

6 Claims, 4 Drawing Sheets

LATCH CIRCUIT WITH STATE-WALK LOGIC

BACKGROUND OF THE INVENTION

1. Field of the Invention

The present invention generally relates to latch circuits and, more particularly, to an improved dynamic random access memory (DRAM) input latch circuit that makes the transition from "set" to "latched" states without the need for multiple phases, critical timing or introduction of extra periods into any timings to account for worst case scenarios.

2. Description of the Related Art

In low power computer applications, such as battery powered lap top computers, it is conventional to provide a "row address receiver" for dynamic random access memories (DRAMs) which is completely quiescent; that is, the circuit uses no power until an activation signal is presented. Such a no-quiescent-power requirement is standard in low power applications. To this end, the input receiver(s) for the circuit must be turned off when not being used.

In the prior art, when the receiver is turned off, activation is accomplished in two phases. First, the receiver is powered up. After a suitable delay, its output is evaluated and the result is driven to other circuits on the chip. There is, however, a problem in determining what the "suitable delay" should be since it is not clearly known exactly how long the receiver will take to establish a valid output, this being determined in part by the amplitude of the input signal. An input at one of the supply rails will cause the receiver to establish a valid output quickly, while if it is at the input "specification values", a longer time may be taken.

It is then necessary, in the prior art, to add "fat" (i.e., extra time periods) to the "suitable delay" in order to give the receiver adequate time to develop output with the worst case input signal. This "fat" is then present in every case and usually does not represent real-world operation. Therefore, in most cases, there is a performance penalty.

SUMMARY OF THE INVENTION

It is therefore an object of the present invention to provide a latch circuit for an improved DRAM input latch circuit that makes the transition from "set" to "latched" states without the need for multiple phases, critical timing or introduction of extra periods into any timings to account for worst case scenarios.

According to the invention, there is provided a circuit for input, data conversion, and output. In its basic form, the circuit comprises a pair of identical receiver circuits of opposite logic state when off, with clock and data inputs and true and complementary outputs. The receivers are turned on by an activating clock signal. When the receivers are enabled, address data is evaluated as soon as it is received causing the latch to be set. This is the first step in the "state walk" of the latch. The outputs of the latch are fed back to turn off the receiver circuits completing the second step of the "state walk". The circuit now ignores any changes in the input address data, thus latching the input data.

The goal of the circuit according to the invention was to have a receiver which could be shut off in two different ways. One way of shutting off the circuit would be to leave the output high. The other way of shutting off the circuit would be to leave the output low. The same address signal is routed to the two identical receivers, but opposite methods of shutting them off are used. Thus, in the off state, the outputs of the two receivers are in opposite states. When the clock activation signal is used to turn on the two receivers, they will eventually wind up with their outputs in the same state. However, no matter whether the input is high or low, the output of one of the two receivers will have a transition. This transition can then be used to propagate the result signal to the rest of the chip. There is no need for a "suitable delay" since the circuit operates as fast as possible using the given inputs.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
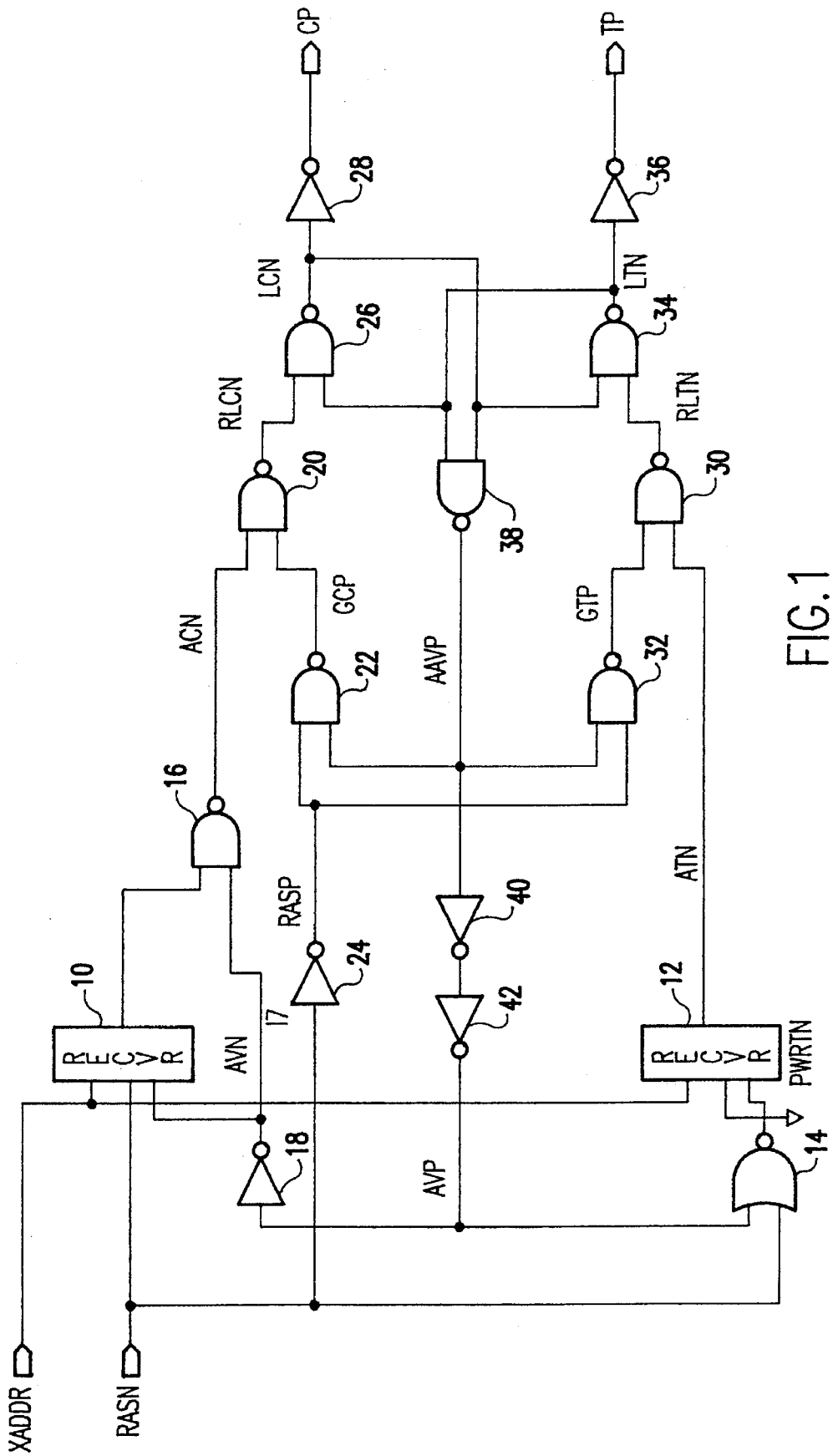
FIG. 1 is a simplified schematic diagram of a row address receiver for a dynamic random access memory (DRAM) in accordance with the present invention.

Referring now to the drawings, and more particularly to FIG. 1, there is shown by way of example a simplified schematic diagram of row address receiver incorporating the subject invention. There are two identical receivers 10 and 12 in this circuit. Each receiver has three inputs and a single output. The top input is used for the address data input. The middle input turns the receiver off when high and enables it when low. The bottom input turns the receiver off when low and enables it when high. When the receiver is turned off by the middle input, the output will be low. When the receiver is turned off by the bottom input, the output will be high. The middle input is dominant in that if both middle and bottom inputs are turning the receiver off, the output will be low.

Figure 2:
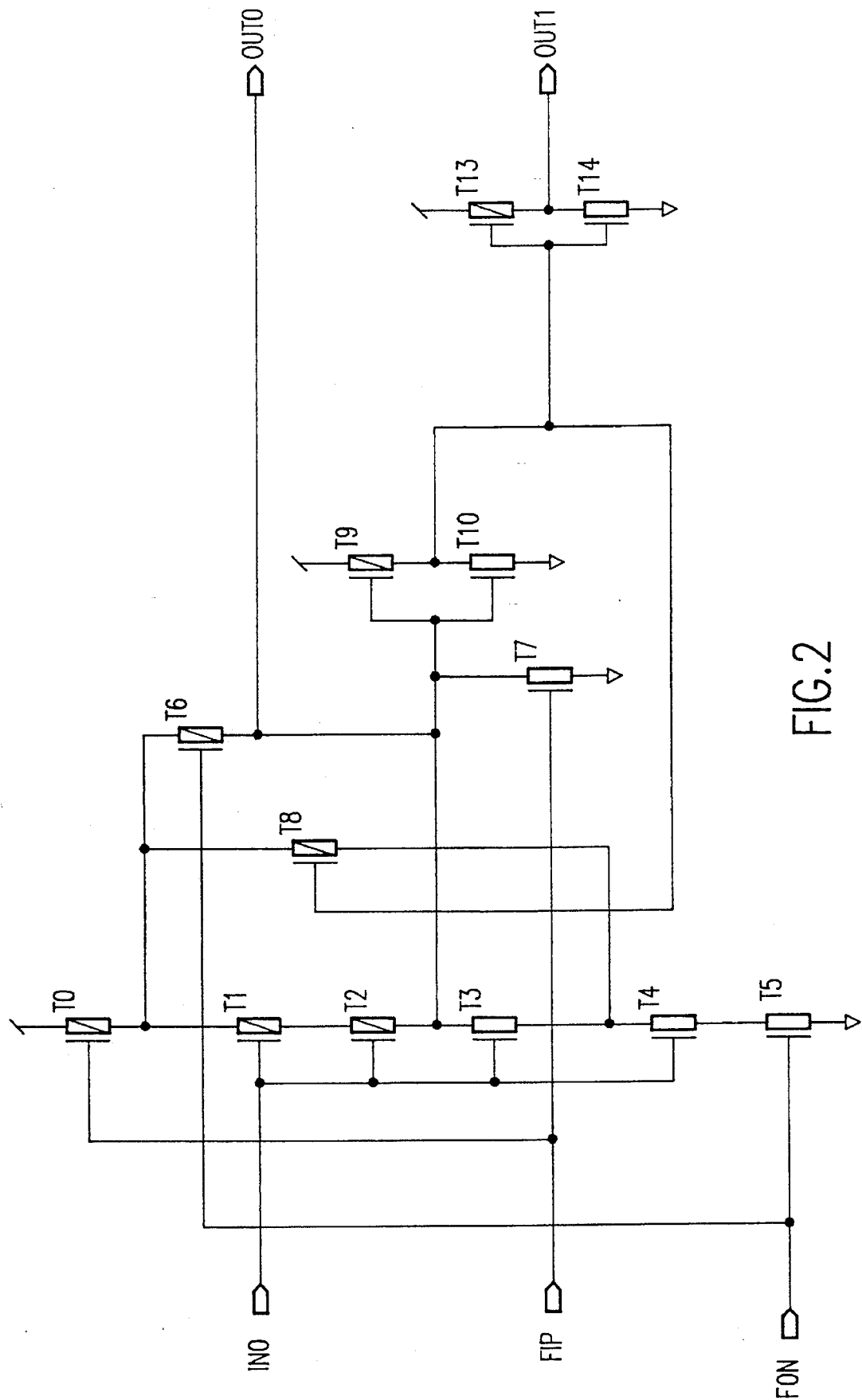
FIG. 2 is a schematic diagram illustrating in more detail the circuitry of the receiver circuits used in the circuit of FIG. 1.

The schematic of a receiver is shown in Figure 2, to which reference is now made. The three inputs are labeled, from top to bottom, IN0, F1P, and F0N. Input IN0 is applied to the gates of p-type field effect transistors (FETs) T1 and T2 and n-type FETs T3 and T4, input F1P is applied to the gates of p-type FET T0 and n-type FET T7, and input F0N is applied to the gates of n-type FET T5 and p-type FET T6. FETs T0 to T5 are connected in series between a source voltage and circuit ground. FET T6 is connected between the junction of FETs T0 and T1 and the junction of FETs T2 and T3. FET T7 is connected between the junction of FETs T2 and T3 and circuit ground. In addition, a p-type FET T8 is connected between the junction of FETs T0 and T1 and the junction of FETs T3 and T4. The junction of FETs T2 and T3 is connected to an inverter composed of p-type FET T9 and n-type FET T10, the output of which is connected both to the gate of FET T8 and a second inverter composed of p-type FET 13 and n-type FET 14. The function of FET T8 is to provide hysteresis for the receiver, a common practice. In this circuit, there are two outputs labeled OUT0 and OUT1 respectively connected to the junction of FETs T2 and T3 and the output of the second inverter. In the application shown in FIG. 1, only output OUT0 is used. The truth table for the circuit shown in FIG. 2 is shown below:

| F1P | F0N | IN0 | OUT0 |
|-----|-----|-----|------|
| 0 | 0 | X | 1 |
| 0 | 1 | DATA | DATA |
| 1 | 0 | X | 0 |
| 1 | 1 | X | 0 |

In the above truth table, X means "don't care"

Returning now to FIG. 1, the inputs to the circuit are the address (XADDR) data signal and a clock activation signal (RASN). As mentioned, the address signal is supplied to the top inputs of both receivers 10 and 12. The activation signal is supplied to the middle input of receiver 10 and via NOR gate 14 to the bottom input of receiver 12. The output of receiver 10 is connected to one input of NAND gate 16, the other input of NAND gate 16 being supplied by inverter 18 which is also connected to the bottom input of receiver 10. The output of NAND gate 16 is connected to one input of NAND gate 20. The other input of NAND gate 20 is supplied by NAND gate 22, having as one input the output of inverter 24 which receives as its input the clock activation signal (RASN). The output of NAND gate 20 is supplied as one input to NAND gate 26, the output of which is inverted by inverter 28 to provide the first, or complement, output labeled CP.

The middle input of receiver 12 is connected to receive a power on signal (PWRTN), and its output is connected as one input to NAND gate 30. The other input of NAND gate 30 is supplied by the output of NAND gate 32, having as one input the output of inverter 24. The output of NAND gate 30 is supplied as one input to NAND gate 34, the output of which is inverted by inverter 36 to provide the second, or true, output labeled TP.

The output of NAND gate 26 is connected to the second input of NAND gate 34 and one input of NAND gate 38. The output of NAND gate 34 is connected to the second input of NAND gate 26 and to the other input of NAND gate 38. The output of NAND gate 38 is connected to the second inputs of each of NAND gates 22 and 32 and supplied via inverters 40 and 42 to inverter 18 and NOR gate 14. Those skilled in the art will recognize that the cross-coupled NAND gates 26 and 34 form a latch. The operation of this latch circuit is described in more detail below.

Figure 3:
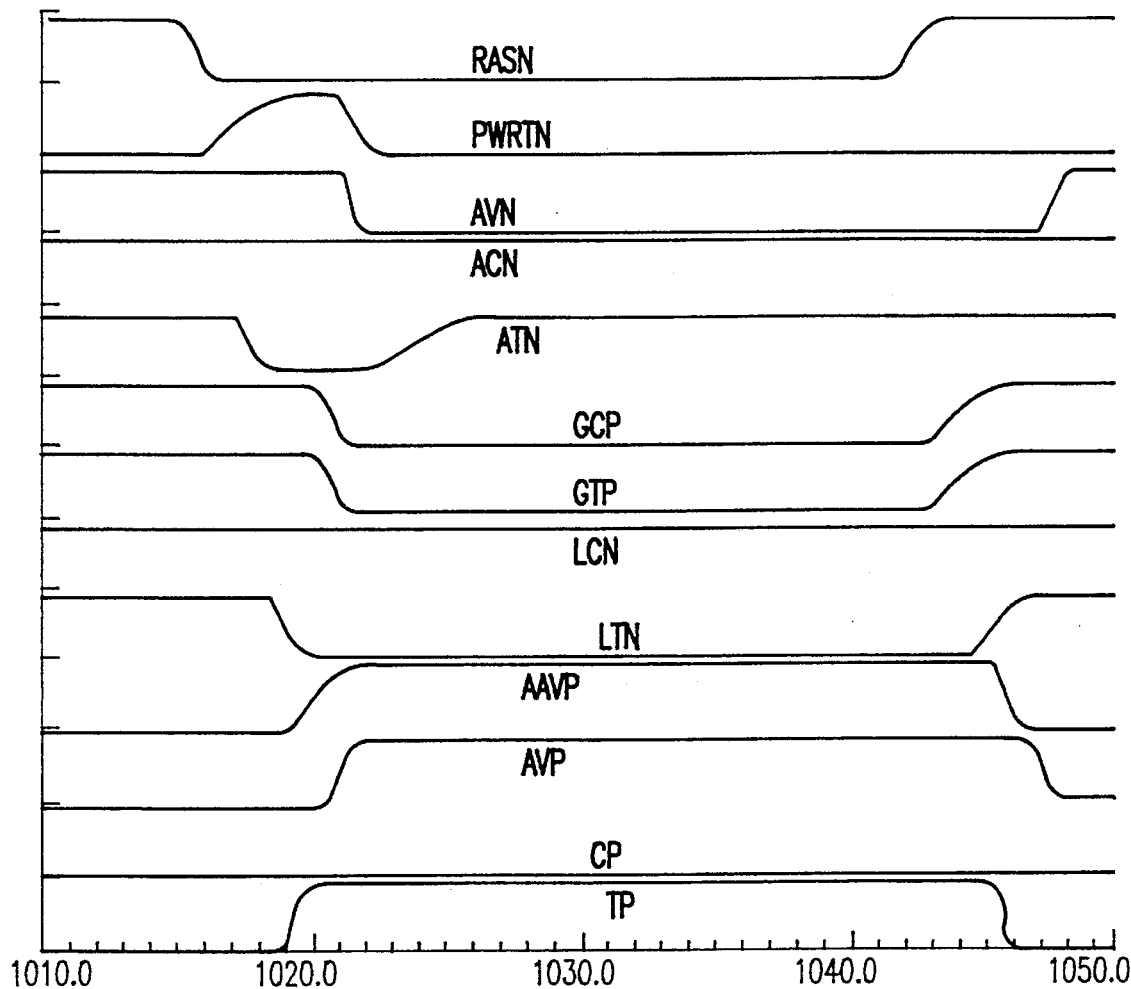
FIG. 3 is a timing diagram illustrating the operation of the circuit of FIG. 1.

Referring now to FIG. 3 in addition to FIG. 1, there is shown a timing chart in which the respective signals as labeled at different points in FIG. 1. In the "resting state"the clock activation signal (RASN) will be high, so the output of receiver 10 will be low, and the output of NAND gate 16 (ACN) will be high. Also, the power on signal (PWRTN) will be low, and the output of receiver 12 (ATN) will be high. The inverted clock activation signal (RASP) from inverter 24 is low, so both the signal GCP from NAND gate 22 and the signal GTP from NAND gate 32 will be high, causing both the signal RLCN from NAND gate 20 and the signal RLTN from NAND gate 30 to be low. This places the latch comprising NAND gates 26 and 34 in a "metastable" state. Both LTN output from NAND gate 34 and LCN output from NAND gate 26 are high, and both outputs CP and TP are low. Also, since LTN and LCN are both high, the output of NAND gate 38 (AAVP) is low, as is the AVP output from inverter 42. The AVN output from inverter 18 is therefore high.

When RASN falls, it directly turns on receiver 10 and turns on receiver 12 through NOR gate 14 and signal PWRTN. Eventually, the receivers 10 and 12 respond to the input XADDR. Since XADDR for this case is high, the output of both receivers will go low, but since the output of receiver 10 is already low, there is no change, and ACN remains high. The output ATN of receiver 12 on the other hand was high and now falls.. When ATN falls, the output of NAND gate 30 (RLTN) rises, which ships the developed address to the rest of the chip through NAND gate 34 and inverter 36. This is the first "step" in the "statewalk" where the latch comprised of NAND gates 26 and 34 moves from the "metastable" state to the "set" state. At the same time, the fall of the output of NAND gate 34 (LTN) at the input of NAND gate 38 causes the signal AAVP to rise.

When RASN fell, RASP rose, and when this is combined with the rise of AAVP at NAND gates 22 and 32, both GCP and GTP fall. This causes the outputs of both NAND gates 20 and 30 (signals RLCN and RLTN, respectively) to be high. Note that RLTN was already high as a result of the response of receiver 12. The circuit will now ignore further changes in the input state of XADDR; that is, the input has been "latched". At this point, the latch has taken the second "step" in the "state-walk" from "set" to "latched"It is significant to note here that all of these events were caused by a single event, the fall of the RASN signal. There was no need for multiple phases or any critical timing or introduction of "fat" into any timings. Also, when the AAVP signal rises, signal AVP will rise as well, and the signal AVN will fall as does signal PWRTN, turning off receivers 10 and 12. The operation is now complete, and no further receiver power is consumed.

For the case of a low input for the address signal XADDR, the events are similar. The output of receiver 10 goes high and the output of NAND gate 16 (ACN) falls. The rest of the operation is identical to the case where the address signal XADDR is high except that the output of NAND gate 26 (LCN) goes low and CP goes high.

When the clock activation signal RASN goes high again, at the end of the cycle, signal RASP goes low, causing signals GCP and GTP to go high. Because signals ACN and ATN both went high when the receivers 10 and 12 were turned off by the signal AAVP, signals RLCN and RLTN go low. Then signals AAVP, CP and TP go low followed by signal AVP going high and signal AVN going low. The circuit is now in condition for the activation signal RASN to fall again and evaluate a new input at XADDR.

Figure 4:
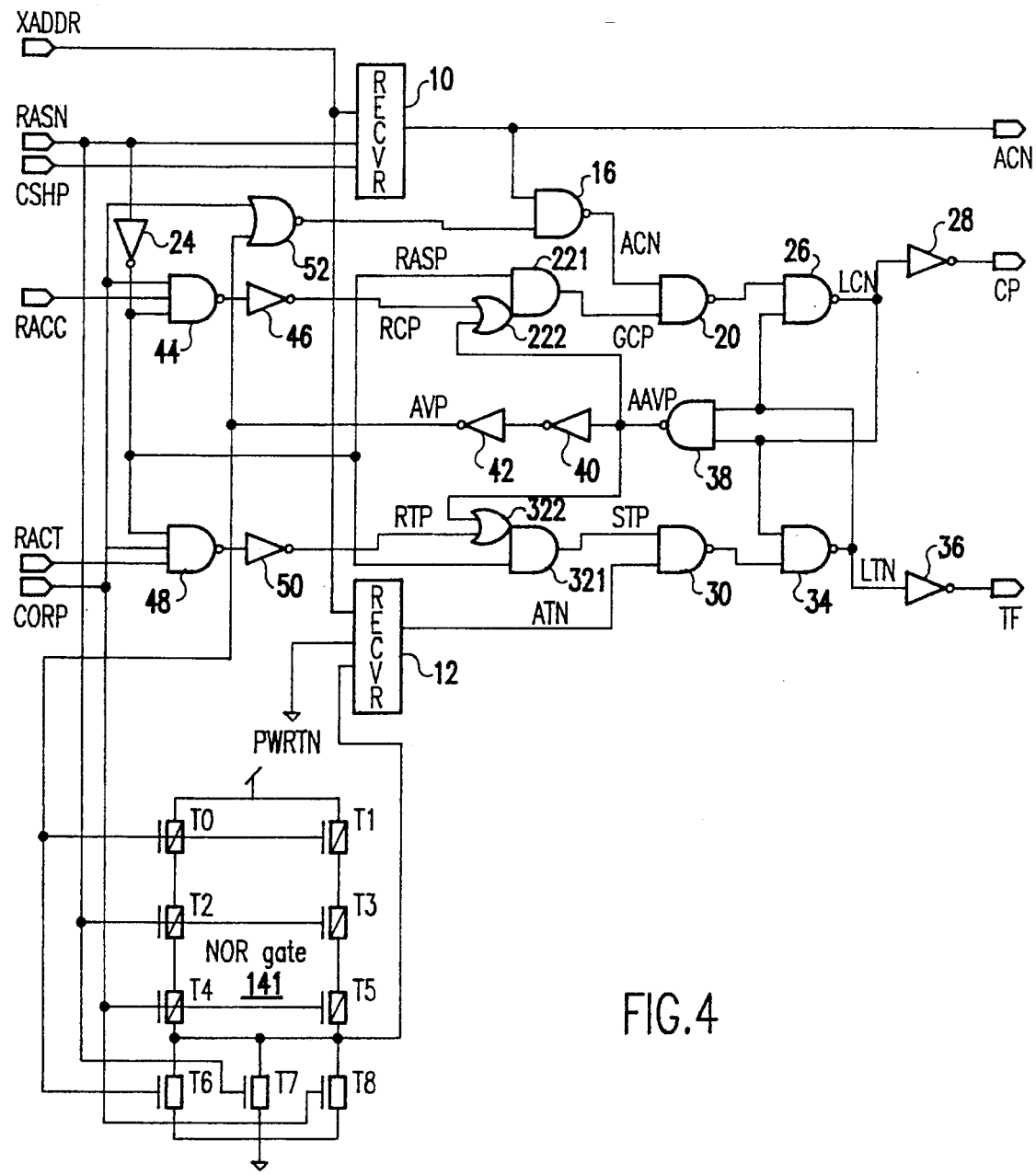
FIG. 4 is a more detailed schematic diagram of a row address receiver for a DRAM in accordance with the present invention.

FIG. 4 is a more detailed schematic diagram of the row address receiver shown in simplified form in FIG. 1. In FIG. 4, the same reference numerals indicate the same components described above. As before, the XADDR signal is applied to the top inputs of the two receivers 10 and 12. The clock activation signal RASN is applied directly to the second input of receiver 10 and, via a three-input NOR gate 141, to the bottom input of receiver 12. However, instead of being turned off by the AVN signal output from inverter 18, the third input to receiver 10 is connected directly to a signal CSHP. Receiver 10 in FIG. 4 is also used by the column address circuitry. The signal CSHP is part of the column address control. For the purposes of this implementation, receiver 10 is left powered on for use by the column address circuitry, and during the period of interest the signal CSHP is high and does not affect circuit function.

There are additionally provided inputs for signals RACC, RACT and CORP signal inputs. The signals RACC and RACT are respectively the complementary and true outputs of a refresh address register. They are ungated, as the gating for them is provided by NAND gates 44 and 48 of FIG. 4. The signal CORP is high when the RASN input to FIG. 4 falls, indicating a CAS-before-RAS refresh is to be done, so the pad address at the receivers is blocked and the address is taken from the RACC and RACT inputs. Conversely, if CORP is low when RASN falls, RACC and RACT are ignored and the circuit operation is essentially identical to FIG. 1.

The RASP signal is derived from the RASN signal by inverter 24 as before, but NAND gate 22 is replaced by AND gate 221 and OR gate 222. OR gate 222 receives as one input the AAVP output from NAND gate 38. The other input, denoted as RCP is output by the combination of NAND gate 44 and inverter 46. The inputs to the NAND gate 44 are the RASP signal from inverter 24, the RACC signal and the CORP signal. Similarly, NAND gate 32 is replaced by AND gate 321 and OR gate 322. OR gate 322 receives as one input the AAVP signal from NAND gate 38 . The other input, denoted as RTP is output by the combination of NAND gate 48 and inverter 50. The inputs of NAND gate 48 are the RASP signal from inverter 24, the RACT signal and the CORP signal. Meanwhile, the AVP signal from inverter 42 is supplied as one input to NOR gate 52, the output of which is connected to the second input of NAND gate 16. The other input to NOR gate 52 is the CORP signal. The CORP signal is also applied to the third input of NOR gate 141.

The key difference between the circuit as shown in FIG. 4 and that of FIG. 1 is the provision for a refresh address counter (RAC) input in the form of signals RACC and RACT. Modern DRAMs include a RAC so that the system need not generate the correct address for refresh cycles. That is taken care of internally. This type of operation is signified by the DASN input being low when the RASN input falls. These differences in the schematic are the CORP, RACT and RACC inputs as well as sufficient gating to bring them to Axx and Axx, where they replace the ATN and ACN signals as the significant inputs. In addition, receiver 10 is kept in use after row addresses are evaluated in order to develop column addresses. This is indicated by the third output ACN supplied directly by the output of the receiver 10. The other receiver 12 is powered off since it is no longer needed. In the simplified schematic of FIG. 1, both receivers 10 and 12 are powered off after circuit output is developed.

The specific circuitry has been described in terms of conventional NAND and NOR logic; however, it will be understood that equivalent conventional AND and OR logic may be substituted. Thus, while the invention has been described in terms of the embodiments described above, those skilled in the art will recognize that the invention can be practiced with modification within the spirit and scope of the appended claims.

Having thus described my invention, what we claim as new and desire to secure by Letters Patent is as follows:

1. A latch circuit comprising:
   input means for receiving a data input signal and enabled by a clock signal to generate first and second outputs;
   state-walk logic circuitry connected to said input means for evaluating the first and second outputs of the input means when enabled by a signal complementary to the clock signal; and
   a latch set by the state-walk logic circuitry according to evaluation of the first and second outputs, outputs of the latch being fed back to said state-walk logic circuitry to prevent the latch from changing state in response to the input data thereby making the transition from "set" to "latched" states without the need for multiple phases, critical timing or introduction of extra periods into any timings to account for worst case scenarios.

2. The latch circuit recited in claim 1 wherein said state-walk logic circuitry comprises:
   first and second NAND gates respectively connected to receive as inputs the first and second outputs of said input means, outputs of said first and second NAND gates being connected to said latch to set said latch;
   a third NAND gate receiving as inputs outputs of said latch; and
   fourth and fifth NAND gates connected to receive as one input an output of said third NAND gate and as a second input said clock signal, outputs of said fourth and fifth NAND gates being respectively connected to inputs of said first and second NAND gates.

3. The latch circuit recited in claim 2 wherein said latch comprises sixth and seventh cross-coupled NAND gates.

4. The latch circuit recited in claim 1 wherein said input means comprises:
   first and second identical receiver circuits having opposite logic states when off, each of said receiver circuits having a data input and first and second control inputs and an output, the first control input turning the receiver off when high and enabling it when low, the second control input turning the receiver off when low and enabling it when high, and when the receiver is turned off by the data input, the output will be low, but when the receiver is turned off by the second control input, the output will be high, the first control input being dominant in that if both the first and second control inputs are turning the receiver off, the output will be low;
   an data input connected to the data inputs of both said first and second receivers; and
   an activating clock signal input connected to said first control input of said first receiver and via a NOR gate to the first control input of the second receiver, said receivers being activated by said activating clock signal.

5. The latch circuit recited in claim 4 wherein said state-walk logic circuitry comprises:
   first and second NAND gates respectively connected to receive as inputs the outputs of said first and second receivers, outputs of said first and second NAND gates being connected to said latch to set said latch;
   a third NAND gate receiving as inputs outputs of said latch and supplying an input to said NOR gate;
   fourth and fifth NAND gates connected to receive as one input an output of said third NAND gate and as a second input said clock signal, outputs of said fourth and fifth NAND gates being respectively connected to inputs of said first and second NAND gates.

6. The latch circuit recited in claim 5 further comprising:
   sixth NAND gate connected to the output of said first receiver and having an output connected to said first NAND gate; and
   an inverter receiving the output of said third NAND gate and supplying an output to the second control input of said first receiver and to the sixth NAND gate.

* * * * *